(12) United States Patent
Ho et al.

(10) Patent No.: US 8,298,939 B1
(45) Date of Patent: Oct. 30, 2012

(54) METHOD FOR FORMING CONDUCTIVE CONTACT

(75) Inventors: Jar-Ming Ho, Taoyuan County (TW); Yi-Nan Chen, Taoyuan County (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/162,536

(22) Filed: Jun. 16, 2011

(51) Int. Cl.
*H01L 21/44* (2006.01)
(52) U.S. Cl. ............... 438/657; 438/672; 257/E21.507
(58) Field of Classification Search ............. 438/597, 438/637–647, 657, 666–675
See application file for complete search history.

(56) References Cited

U.S. PATENT DOCUMENTS

| | | | |
|---|---|---|---|
| 2007/0090466 A1* | 4/2007 | Park et al. | 257/382 |
| 2007/0145519 A1* | 6/2007 | Peng et al. | 257/506 |
| 2010/0155799 A1* | 6/2010 | Yokoyama | 257/296 |
| 2010/0258799 A1* | 10/2010 | Matsuoka | 257/49 |

* cited by examiner

*Primary Examiner* — Leonard Chang
*Assistant Examiner* — Calvin Choi

(57) ABSTRACT

A method for fabricating a conductive contact is provided, including: providing a semiconductor substrate with a dielectric layer formed thereover and two conductive regions and an isolation element formed therein, wherein the isolation element isolates the two conductive regions from each other; forming an opening in the dielectric layer, exposing a top surface of the isolation element and a portion of a top surface of each of the conductive regions; performing an epitaxy process and forming a conductive semiconductor layer within the opening, overlying the top surface of the isolation element and the portion of the top surface of each of the conductive regions; and forming a conductive layer in the opening, overlying the conductive semiconductor layer and filling the opening.

9 Claims, 5 Drawing Sheets

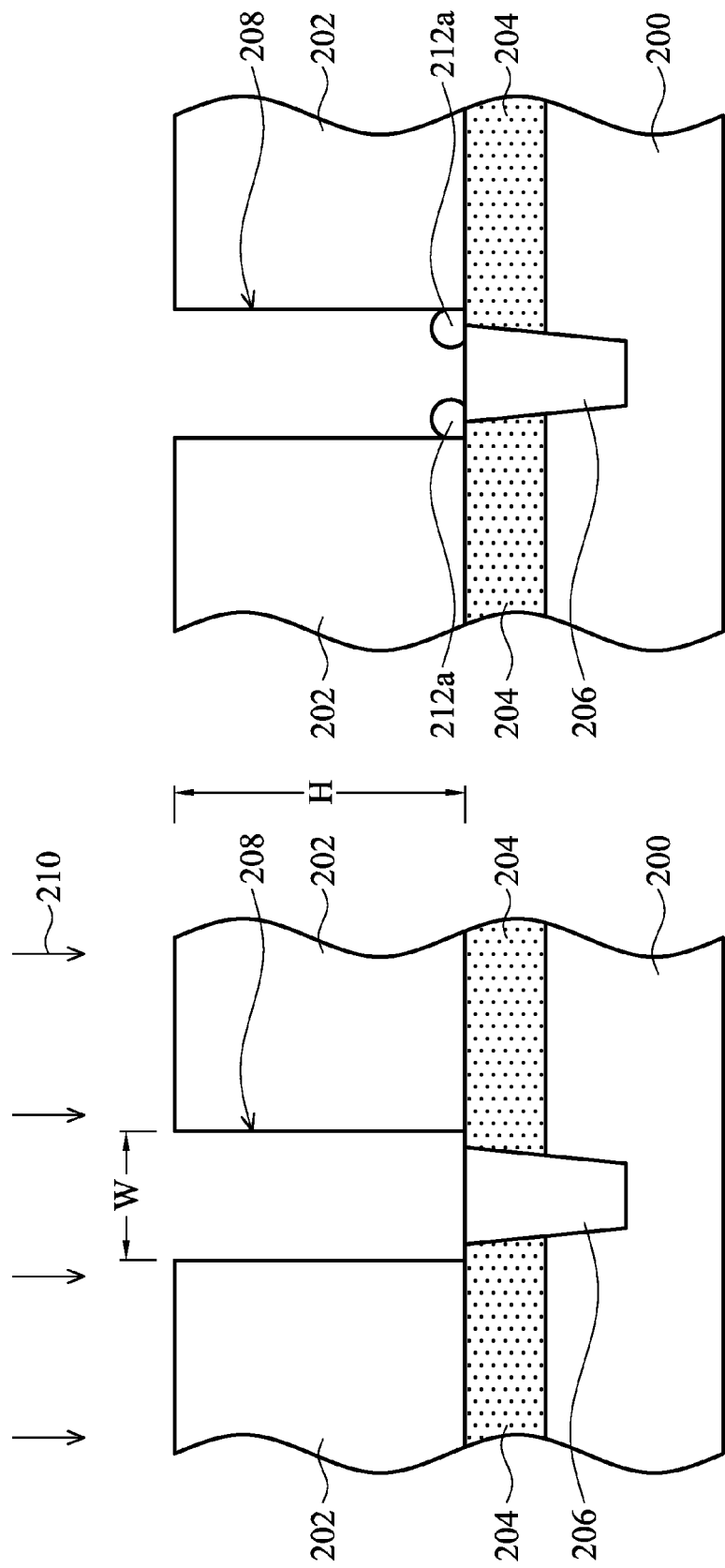

US 8,298,939 B1

METHOD FOR FORMING CONDUCTIVE CONTACT

BACKGROUND OF THE INVENTION

1. Field of the Invention

The present invention relates to a method for fabricating a semiconductor structure, and more particularly to a method for fabricating a conductive contact with reduced contact resistances.

2. Description of the Related Art

Recently, along with progressive micro-sizing of semiconductor devices, degree of integration has also increased. Accordingly, the dimensions of the diameters of conductive contacts of semiconductor devices have been reduced.

Thus, the fabrication technique for forming a conductive contact in the interlayer insulating film between a conductive region of a semiconductor substrate and an upper wiring level layer over the interlayer insulating film is one of the most important fabrication techniques for semiconductor fabrication today. As the degree of density of integration of integrated circuit devices increases, contact resistances of the conductive contacts formed in the insulating layer is further increased along with the reduction of the dimensions of the diameters of conductive contacts.

Thus, it is necessary to develop a method for fabricating a conductive contact with reduced contact resistances for semiconductor devices of further reduced-sizes.

BRIEF SUMMARY OF THE INVENTION

An exemplary method for fabricating a conductive contact comprises: providing a semiconductor substrate with a dielectric layer formed thereover and two conductive regions and an isolation element formed therein, wherein the isolation element isolates the two conductive regions from each other; forming an opening in the dielectric layer, exposing a top surface of the isolation element and a portion of a top surface of each of the conductive regions; performing an epitaxy process and forming a conductive semiconductor layer within the opening, overlying the top surface of the isolation element and the portion of the top surface of each of the conductive regions; and forming a conductive layer in the opening, overlying the conductive semiconductor layer and filling the opening.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 5-9 are schematic diagrams showing a method for fabricating a conductive contact according to another embodiment of the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
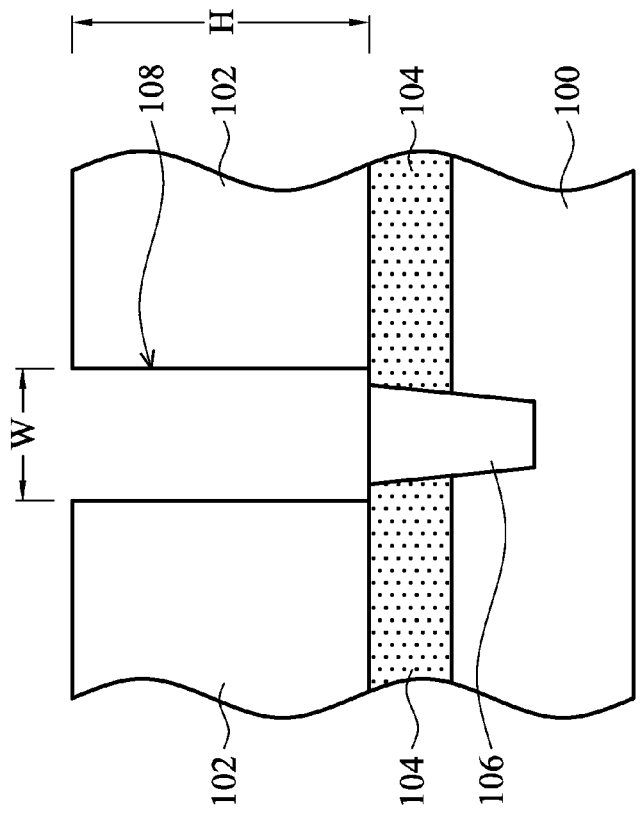
FIGS. 1-4 are schematic diagrams showing a method for fabricating a conductive contact according to an embodiment of the invention.
Figure 1:
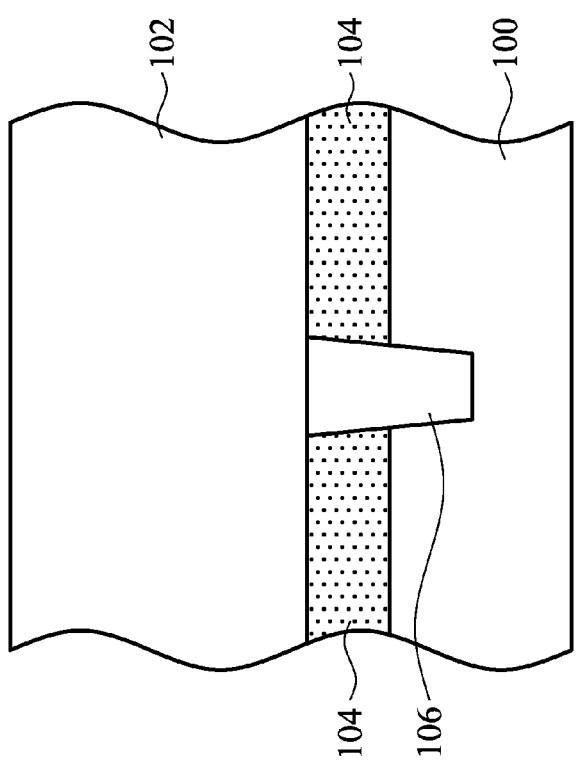
Figure 4:
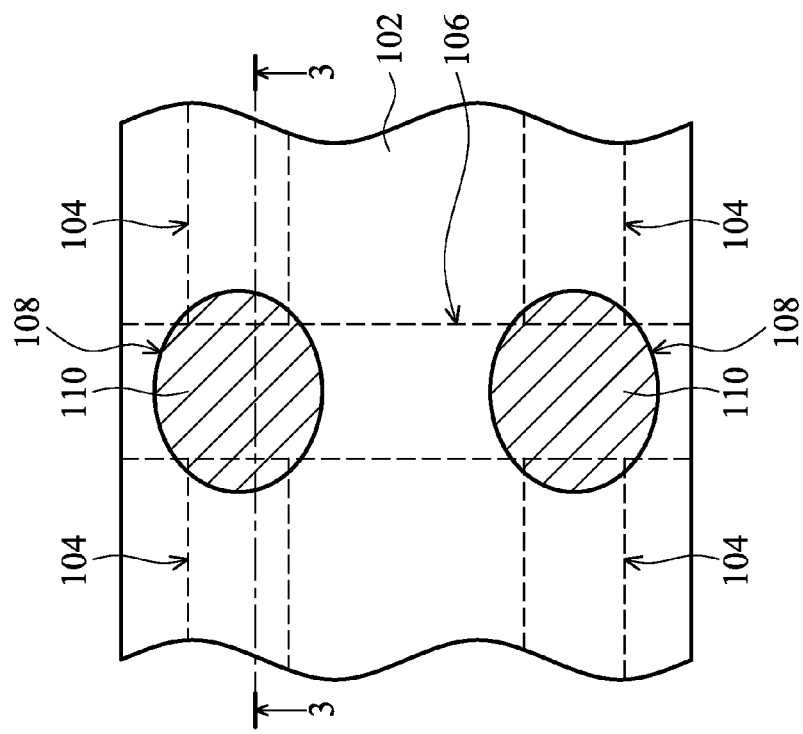
Figure 3:
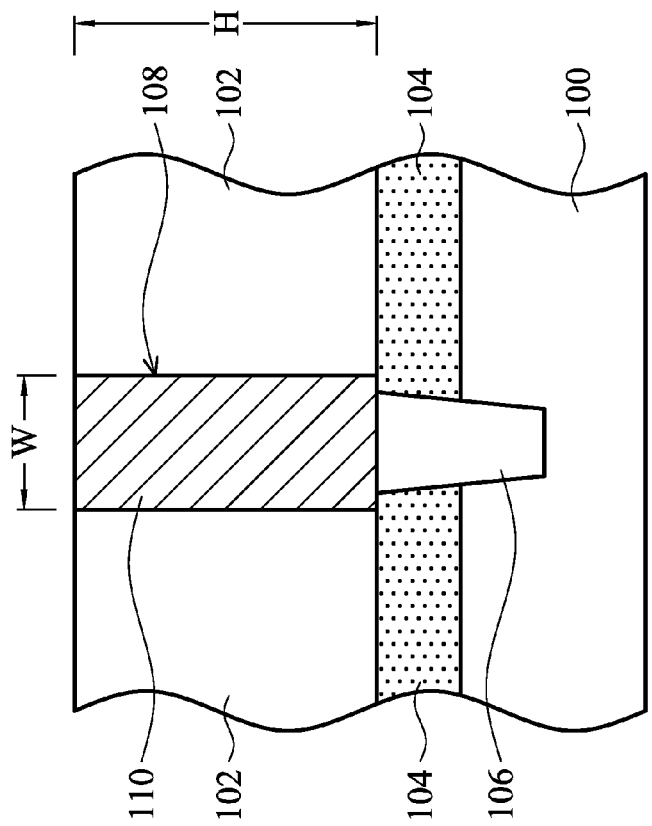

FIGS. 1-4 are schematic diagrams showing an exemplary method for fabricating a conductive contact, wherein FIGS. 1-3 show schematic cross sections and FIG. 4 shows a schematic top view of the method. Herein, the exemplary method is a method known by the inventors and is used as a comparative example to comment on the problems found by the inventors, but is not used to restrict the scope of the invention.

In FIG. 1, a semiconductor substrate 100 is first provided with a dielectric layer 102 formed thereover. The semiconductor substrate 100 can be, for example, a silicon substrate, and the dielectric layer 102 can be, for example, a silicon oxide layer. In addition, the semiconductor substrate 100 is provided with a plurality of conductive regions 104 and an isolation element 106 therein. The isolation element 106 can be a shallow trench isolation (STI) shown in FIG. 1 but is not limited thereto. The isolation element 106 isolates the conductive regions 104 from each other. In one embodiment, the semiconductor substrate 100 can be a p-type doped substrate and the conductive regions 104 can be, for example, n-type doped regions which may both function as source or drain regions of a transistor (not shown) in a memory cell of a dynamic random access memory (DRAM) device.

In FIG. 2, the dielectric layer 102 is then patterned to form an opening 108 therein, having a width or diameter W and a depth H. The opening 108 exposes a top surface of the isolation element 106 and a portion of a top surface of each of the conductive regions 104 adjacent to the isolation element 106. Herein, the opening 108 functions as a contact hole and is formed with an aspect ratio (H:W) of, for example, 1:1-5:1.

In FIG. 3, a conductive material such as metal or doped polysilicon is then deposited over the dielectric layer 102 and entirely fills the opening 108, and a portion of the conductive material above a top surface of the dielectric layer 102 is then removed by a planarization process (not shown) such as a chemical mechanical polishing (CMP) process, thereby leaving a conductive contact 110 in the opening 108 for physically and electrically connecting the conductive regions 104 with a sequentially formed conductive element (not shown), for example, a conductive wire, formed over the dielectric layer 102. FIG. 4 shows a top view of the structure shown in FIG. 3, and the structure shown in FIG. 3 shows a cross section taken along a line 3-3 in FIG. 4.

However, as shown in the exemplary structure as illustrated in FIGS. 3-4, since the dimension such as a width or a diameter W of the opening 108 will be further decreased with the shrinkage of the semiconductor device comprising the exemplary structure as illustrated in FIGS. 3-4, the aspect ratio of the opening 108 will be further increased such that filling of the conductive material of the conductive contact 110 in the opening 108 becomes problematic. Thus, voids or seams may be formed in the conductive contact 110 and thereby cause an open circuit between the conductive regions 104 and sequentially formed conductive elements (not shown) thereover. In addition, a hetero-junction between the conductive regions 104 and the conductive contact 110 is small since the conductive contact 110 only partially covers a portion of a top surface thereof, such that a contact resistance of the conductive contact 110 is further increased as an area of the hetero-junction between the conductive regions 104 and the conductive contact 110 is further reduced.

Figure 9:
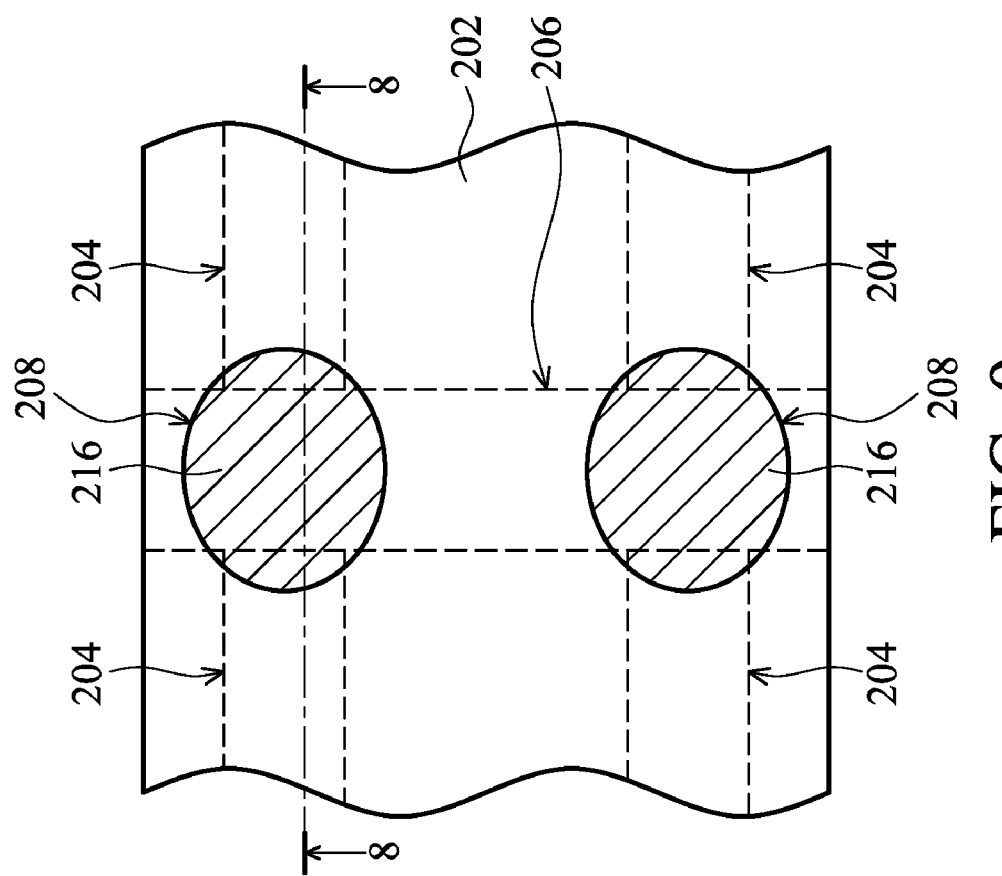

Thus, an improved method for fabricating a conductive contact to address the above issues is needed. FIGS. 5-9 are cross sections showing an exemplary method for fabricating a conductive contact mitigating the above issues, wherein FIGS. 5-8 show schematic cross sections and FIG. 9 shows a schematic top view of the method.

In FIG. 5, a semiconductor substrate 200 is first provided with a dielectric layer 102 formed thereover. The semiconductor substrate 200 can be, for example, a silicon substrate, and the dielectric layer 202 can be, for example, a silicon oxide layer. In addition, the semiconductor substrate 200 is provided with a plurality of conductive regions 204 and an isolation element 206 therein. The isolation element 206 is illustrated as a shallow trench isolation (STI) in FIG. 5 but is not limited thereto, and the isolation element 206 isolates the conductive regions 204 from each other. In one embodiment, the semiconductor substrate 200 can be, for example, a p-type substrate and the conductive regions 204 can be, for example, n-type doped regions which may both function as source or drain regions of a transistor (not shown) in a memory cell of a dynamic random access memory (DRAM) device. The dielectric layer 202 is then patterned to form an opening 208 therein, having a width or diameter W and a depth H. The opening 208 exposes a top surface of the isolation element 206 and a portion of a top surface of each of the diffusion regions 204 adjacent to the isolation element 206. Herein, the opening 208 functions as a contact hole and is formed with an aspect ratio (H:W) of, for example, 1:1-5:1. Next, an epitaxy process 210 is performed to form a conductive semiconductor layer on the exposed surfaces of the isolation element 206 and the conductive regions 204. The epitaxy process 210 can be, for example, a chemical vapor deposition (CVD) method performed under a temperature of about 850° C., using $SiH_2Cl_2$, HCl and $H_2$ as reacting gases. In the epitaxy process 210, the formed semiconductor material may comprise semiconductor materials such as silicon and may be in-situ doped with conductive dopants such as arsenic (As), phosphorus (P) or other elements, thereby forming a conductive semiconductor layer.

Figures 7, 8:
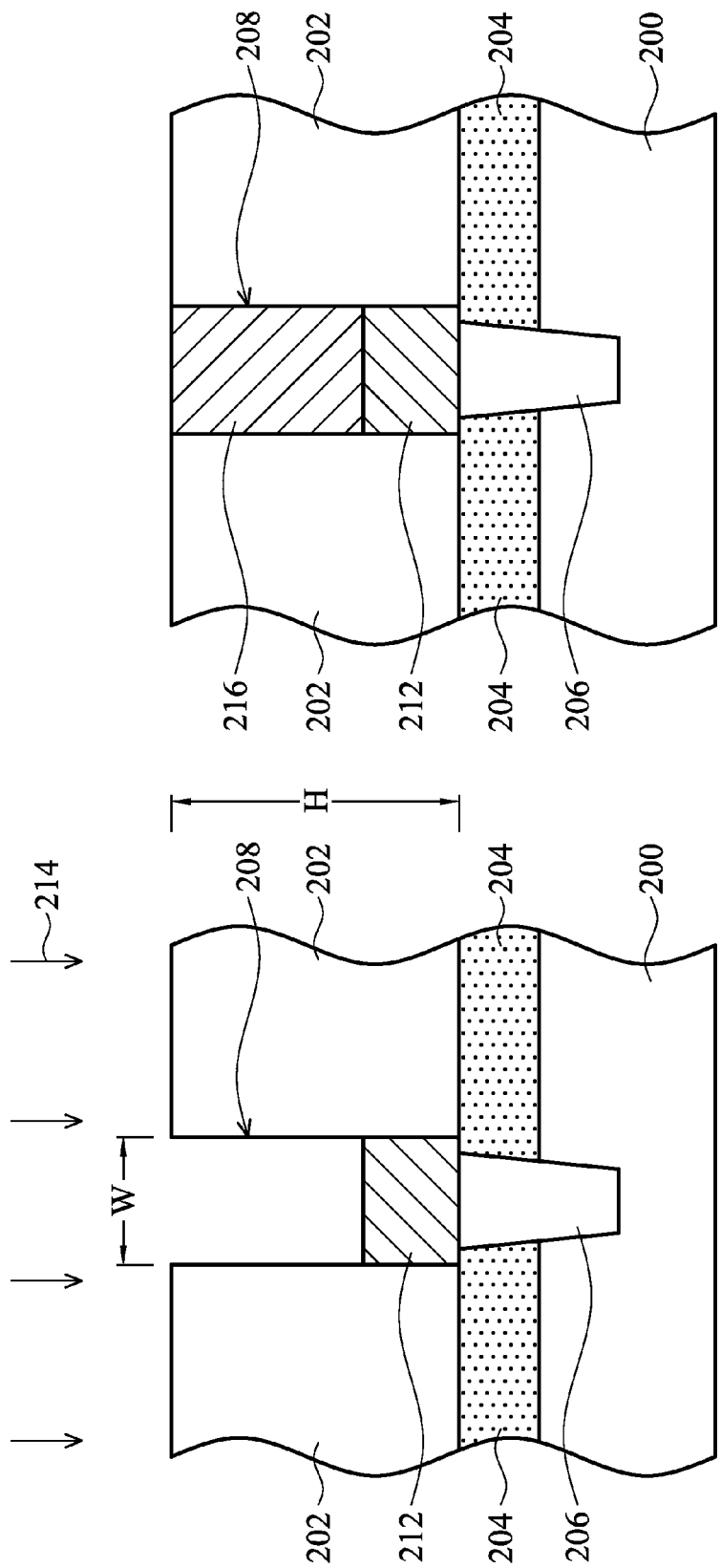

As shown in FIGS. 6-7, during the epitaxy process 210, protrusion portions 212a are first grown from the exposed surfaces of the conductive regions 204, and the protrusion portions 212a grow during the epitaxy process 210 until they merge within the opening 208, thereby forming a conductive semiconductor layer 212 over the isolation element 206 and the conductive regions 204, as shown in FIG. 7. The conductive semiconductor layer 212 is formed with a thickness of about 10-40 Å and partially fills a bottom portion of the opening 208 and has a planar top surface such that the aspect ratio (H:W) of the opening 208 is lowered to, for example, 0.5:1-4:1. Next, a deposition process 214 is performed to deposit a conductive material such as metal or doped polysilicon over the dielectric layer 202 to entirely fill the opening 208, and a portion of the conductive material above a top surface of the dielectric layer 202 is then removed by a planarization process (not shown) such as a chemical mechanical polishing (CMP) process, thereby leaving a conductive layer 216 in the opening 208 for physically and electrically connecting the conductive semiconductor layer 212 and the conductive regions 204 with a sequentially formed conductive element (not shown) such as a conductive wire formed over the dielectric layer 202, as shown in FIG. 8. FIG. 9 shows a top view of the structure shown in FIG. 8, and the structure shown in FIG. 8 is a cross section taken along a line 8-8 in FIG. 9.

In the exemplary structure as disclosed in FIGS. 8-9, due to formation of the conductive semiconductor layer 212, the aspect ratio of the opening 208 can be decreased such that the conductive material of the conductive contact 210 is ensured to entirely be filled into the opening 208, while a dimension such as a width or a diameter W of the opening 208 is further decreased with the shrinkage of a semiconductor device having the opening 208. Thus, no voids or seams will be formed in the conductive contact and the open circuit issue between the conductive regions 204 and sequentially formed conductive elements (not shown) will not occur. In addition, a homojunction is formed between the conductive semiconductor layer 212 and the conductive regions 204, and the conductive layer 216 and the conductive semiconductor layer 212 have a hetero-junction which is much greater than the hetero-junction formed between the conductive contact 110 and the conductive regions 104 as shown in FIGS. 3-4, such that a contact resistance of the conductive contact comprising the conductive layer 216 and the conductive semiconductor layer 212 is reduced, despite shrinkage of the semiconductor device having the conductive contact.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a conductive contact, comprising:
    providing a semiconductor substrate with a dielectric layer formed thereover and two conductive regions and an isolation element formed therein, wherein the isolation element isolates the two conductive regions from each other, and the semiconductor substrate is a p-type substrate and the two conductive regions are n-type regions;
    forming an opening in the dielectric layer, exposing a top surface of the isolation element and a portion of a top surface of each of the conductive regions;
    performing an epitaxy process and forming a conductive semiconductor layer within the opening, overlying the top surface of the isolation element and the portion of the top surface of each of the conductive regions; and
    forming a conductive layer in the opening, overlying the conductive semiconductor layer and filling the opening.

2. The method as claimed in claim 1, wherein the isolation element is a shallow trench isolation element.

3. The method as claimed in claim 1, wherein the opening has an aspect ratio of about 0.5:1-4:1 after formation of the conductive semiconductor layer.

4. The method as claimed in claim 1, wherein the epitaxy process is performed under a temperature of about 850° C., using $SiH_2Cl_2$, HCl and $H_2$ as reaction gases.

5. The method as claimed in claim 4, wherein the conductive semiconductor layer is in-situ doped with conductive dopants during the epitaxy process.

6. The method as claimed in claim 1, wherein the conductive semiconductor layer comprises silicon in-situ doped with arsenic or phosphorus.

7. The method as claimed in claim 1, wherein the conductive layer comprises metal or doped polysilicon.

8. The method as claimed in claim 1, wherein the two conductive regions are both source or drain regions for a transistor.

9. The method as claimed in claim 1, wherein the epitaxy process is performed by a chemical vapor deposition method.

* * * * *